United States Patent [19]
Jun

[11] Patent Number: 6,013,578
[45] Date of Patent: Jan. 11, 2000

[54] METHOD FOR FORMING A METAL WIRING STRUCTURE OF A SEMICONDUCTOR DEVICE

[75] Inventor: Young Kwon Jun, Seoul, Rep. of Korea

[73] Assignee: LG Semicon Co., Ltd., Chungcheongbuk-do, Rep. of Korea

[21] Appl. No.: 08/808,634

[22] Filed: Feb. 28, 1997

[30] Foreign Application Priority Data

Feb. 28, 1996 [KR] Rep. of Korea .................. 96-5000

[51] Int. Cl.⁷ .................................................. H01L 21/44
[52] U.S. Cl. ........................................ 438/687; 438/659
[58] Field of Search .................................... 438/372, 546, 438/551, 563, 702, 695, 705, 687, 659

[56] References Cited

U.S. PATENT DOCUMENTS

| | | | |
|---|---|---|---|
| 3,765,963 | 10/1973 | Okabe et al. | 148/188 |
| 4,698,122 | 10/1987 | Wada et al. | 156/625 |
| 5,024,724 | 6/1991 | Hirono et al. | 156/643 |
| 5,149,378 | 9/1992 | Ohmi et al. | 118/725 |

OTHER PUBLICATIONS

A Dual Damascene Hard Metal Capped CU and Al–Alloy for Interconnected Wiring of ULSI Circuits, H.M. Dalal et al, 0–7803–1450–6, 1993 IEEE, IDEM 93–273, pp. 11.4.1 to 11.4.4.

*Primary Examiner*—Charles Bowers
*Assistant Examiner*—Reneé R. Berry
*Attorney, Agent, or Firm*—Birch, Stewart, Kolasch & Birch, LLP

[57] ABSTRACT

A metal wiring structure includes a conduction line, an insulator film for electrically insulating the conduction line, and a transmutation layer formed as the density of a portion of the insulator film adjacent to the conduction line is increased or by adding impurities to the insulator film. A metal wiring forming method for a semiconductor device, includes the step of forming a trench in a given portion of a silicon oxidation film formed on a semiconductor substrate, forming a transmutation layer on a surface of the silicon oxidation film, and depositing a conductive material on the transmutation layer to form a conduction line, whereby diffusion of the conductive material is prevented.

25 Claims, 3 Drawing Sheets

METHOD FOR FORMING A METAL WIRING STRUCTURE OF A SEMICONDUCTOR DEVICE

BACKGROUND OF THE INVENTION

1. Field of the Invention

The present invention relates to a semiconductor device, and more particularly to a metal wiring structure and a method of forming a metal wiring structure, capable of enhancing the reliability of the semiconductor device by preventing diffusion of a conductive metal, such as, copper (Cu) in the metal wiring structure which prevents a parasitic capacitance.

2. Discussion of Related Art

In general, an aluminum or aluminum alloy film, which has high electrical conductivity and excellent adhesion to a silicon oxide film, is easily patterned by a dry etching method. The dry etching method is cost effective and has been widely used as a method for forming wiring of a semiconductor device. However, because semiconductor devices have been reduced in size, metal wiring requires finer multilayers, and the density thereof also increases. Consequently, poor step coverage results in a contact hole, a via, etc.

That is, in case of forming the metal wiring film by a conventional method, e.g., sputtering an aluminum or aluminum alloy film, a thickness of the metal wiring film is relatively thin in the bent (step) portion thereof due to a shadow effect. More particularly, this phenomenon seriously occurs in the contact hole when the aspect ratio is greater than one. Accordingly, instead of using a conventional physical deposition method, e.g. sputtering, or a chemical vapor deposition (CVD) method capable of depositing the wiring film in a uniform thickness, a tungsten film has been formed by a low pressure vapor deposition method to improve step coverage. However, the resistivity of the tungsten wiring film is twice the resistivity of an aluminum wiring film and, therefore, it is not effective to use tungsten as a wiring film.

Accordingly, in a manufacturing process of the semiconductor device, a method of forming a plug in a contact hole to form a metal wiring has been studied.

In the method for forming a plug mentioned above, the step of forming an aluminum film by a chemical vapor deposition method may be used to improve the step coverage and to maintain continuity with the other conventional process of forming the aluminum wiring film, e.g., conventional sputtering, photographic etching, etc.

However, copper (Cu) has a lower resistivity than aluminum and has an excellent electromigration and stressmigration. Therefore, it is possible to enhance reliability of a semiconductor device using copper, instead of aluminum.

A method of forming a metal wiring film with copper (Cu) by sputtering or using a chemical vapor deposition (CVD) method has been used. Copper has a diffusion factor of about $10^{-8}$ $cm^2/sec$ for diffusing into a silicon layer below the room temperature, which provides a very fast interstitial diffusion rate. The Cu diffused into the silicon layer acts as a recombination center to reduce the life of the minority carrier, thereby deteriorating the characteristic of the semiconductor device.

Accordingly, upon formation of the metal wiring with the copper, a barrier layer has to be formed between the Cu layer and the silicon substrate, as a diffusion barrier layer. The diffusion barrier layer may comprise of W, $Ni_{60}Nb_{40}$, amorphous W—Si, Ta, $TiB_2$, Ta—Si—N and TiN, etc. Among the rest, TiN is widely used as the barrier layer of the aluminum wiring, and a chemical vapor deposition method using an organic metal source (MOCVD) is used to form the diffusion barrier layer. But, as the metal line becomes thinner, the occupation rate of the barrier layer in a deposition structure of the barrier layer and Cu increases and, thereby, the resistance reduction effect of copper decreases in accordance with the use of Cu.

Further, a method which suppresses a diffusion of the Cu by covering the Cu film instead of using a barrier layer, generally uses a conductive material as an insulator film. However, in the conventional methods for forming metal wiring mentioned above, permittivity of the silicon film or aluminum is much greater than that of the silicon oxidation film. Accordingly, a parasitic capacitance of the metal wiring is increased, which deteriorates the performance of the semiconductor device.

Moreover, a metal or metal compound used to form an oxidation and diffusion barrier layer substantially reduces the space for forming a conduction line. As the need to miniaturize semiconductor devices increases, reduction of space for the conduction lines makes it more difficult to prevent breaks and defects in the formal conduction lines.

SUMMARY OF THE INVENTION

Accordingly, the present invention is directed to a metal wiring structure and a method of forming the same that substantially obviates one or more of the problems due to limitations and disadvantages of the related art.

An object of the present invention is to provide a metal wiring structure of copper (Cu) and a method thereof by forming a material layer capable of preventing a diffusion of copper in the metal wiring so as to effectively enhance reliability of the semiconductor device.

To achieve these and other advantages and in accordance with the purpose of the present invention, as embodied and broadly described, a metal wiring structure includes an insulator layer having an upper surface portion converted into a diffusion barrier layer, which is a transmutation layer, and a conductive layer formed on the insulator layer, wherein the diffusion barrier layer prevents diffusion of the conductive layer.

Further, the present invention is directed to a method of forming metal wiring of a semiconductor device, including the steps of: forming a trench in a given part of a silicon oxidation film formed on a semiconductor substrate; forming a transmutation layer on a surface of the silicon oxidation film; and depositing a conductive material on the transmutation layer to form a conduction line.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Reference will now be made in detail to the preferred embodiments of the present invention, examples of which are illustrated in the accompanying drawings.

The present invention is related to a method of improving the performance of a silicon oxidation film for effectively preventing a conductive material from being diffused into a neighboring conductive area, where the conductive material is in the wiring of a semiconductor device. The conductive material is a low resistance metal, such as, copper (Cu), aluminum (Al), or silver (Ag). The wiring structure in accordance with the present invention is as follows.

The wiring structure, which is formed of a conduction line and an insulator film for electrically insulating the conduction line, includes a transmutation layer formed by increasing a density of a part of the insulator film adjacent to the conduction line, or by adding an impurity thereto.

The following is a manufacturing process for forming the metal wiring having the structure as mentioned above in accordance with the present invention.

Figure 1A:
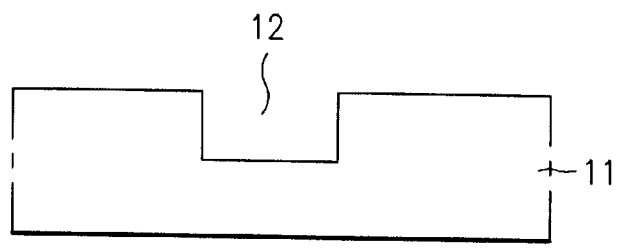
FIGS. 1a to 1d are sectional views for explaining a manufacturing process of a metal wiring in accordance with a first embodiment of the present invention.

As shown in FIG. 1a, a trench 12 is formed on a semiconductor substrate where an insulator film such as a silicon oxidation film 11 is formed.

Figure 1B:
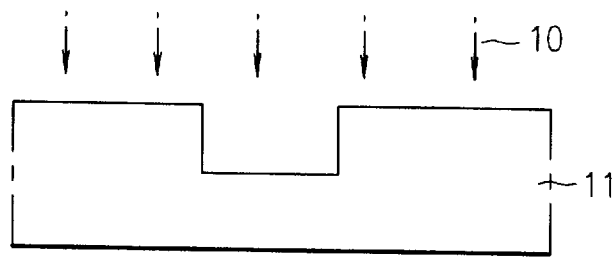

As shown in FIG. 1b, gases 10 which comprise $BH_3$, $PH_3$, $SiH_4$, $Si_2H_6$, $NH_3$, $N_2O$, and carrier gas $N_2$ or Ar, etc. are injected into the silicon oxidation film 11, under a pressure of 0.5–10 torr, Rf power of 0.5–2 $W/cm^2$ and a temperature of 350–450° C. during 10–180 seconds.

Figure 1C:
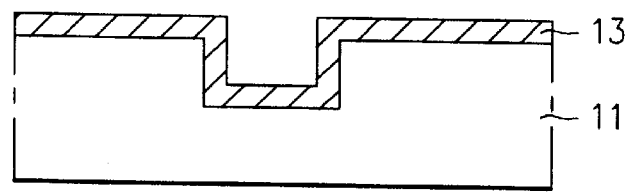

As shown in FIG. 1c, by the injection of gases 10, a density of the silicon oxidation film 11 is increased because a part of the silicon oxidation film 11 is converted to a material capable of preventing diffusion of a conduction line material, e.g., copper, thereby forming a transmutation layer 13. Generally, the density of a plasma enhanced chemical vapor deposition (PECVD) oxidation film is 2.22 $g/cm^3$. But by the present methods, the density of a Si-rich oxidation film with the converted material is increased to 2.26 $g/cm^3$.

Figure 1D:
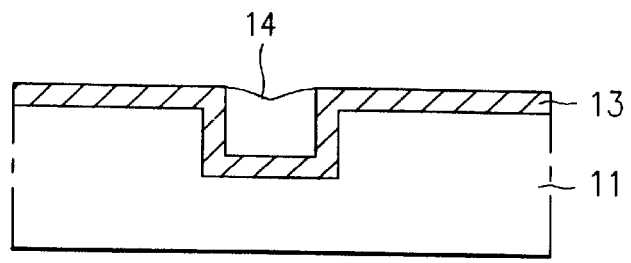

As shown in FIG. 1d, a conductive material layer is formed by a sputtering or CVD method using a source such as (hfac)Cu(VTMS), etc., and is etched back by a chemical mechanical polishing (CMP) method to form a conduction line 14. The conduction line 14 is made of copper, silver, or aluminum. However, copper is preferred and preventing the diffusion of copper will be described below.

A barrier alloy layer of TiN or the like can be additionally formed for improving an adhesion or preventing the diffusion between the conduction line 14 and the silicon oxidation film 11. The barrier alloy layer is formed either between the conduction line 14 and the transmutation layer 13 or between the transmutation layer 13 and the silicon oxidation film 11.

In the metal wiring forming process in accordance with the first embodiment of the present invention as described above, a Cu atom or ion which is to be diffused in the Cu film forms a compound of $Cu_3B_2$, $Cu_3P$, $Cu_3Si$, $Cu_2$, N, etc. in the transmutation layer 13, or an oxide of $Cu(BO_2)_2$, $Cu_3(PO_4)_2$, $CuSiO_4$, $Cu2(NO_3)_2$, etc., by injecting elements such as P, Si, B and N, thereby suppressing the diffusion of Cu.

In FIGS. 2a to 2d, which show sectional views for providing an explanation of the metal wiring forming process in accordance with the second embodiment of the present invention, the silicon oxidation film in a via hole between an upper and lower conduction lines is plasma-processed, i.e., glow discharged, and a metal barrier is formed on a surface of the lower conduction line, thereby suppressing the diffusion of Cu.

Figure 2A:
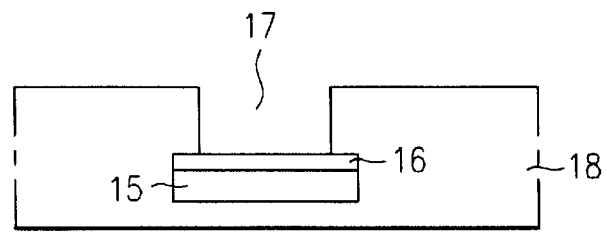
FIGS. 2a to 2d are sectional views for explaining a manufacturing process of a metal wiring in accordance with a second embodiment of the present invention.

First, as shown in FIG. 2a, a contact hole 17 is formed on the semiconductor substrate where the lower conduction line 15 and the interfacial insulator film 18, which is a silicon oxidation film type, selectively expose a high melting point metal film 16 using Ti, Ta, W, etc., deposited on the surface of the lower conduction line 15.

Figure 2B:
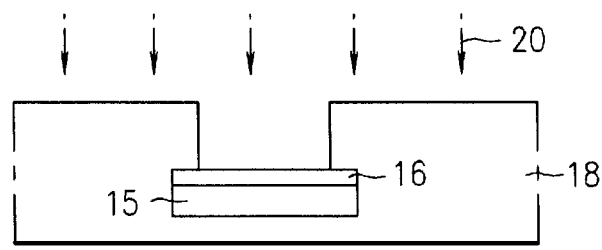

Referring to FIG. 2b, gases 20 which comprise of $SiH_4$, $Si_2H_6$ and $NH_3$, etc., and carrier gas $N_2$ or Ar, etc. are injected into the silicon oxidation film 18 together, under a pressure of 0.5–10 torr, Rf power of 0.5–2 $W/cm^2$ and a temperature of 350–450° C. during 10–180 seconds.

Figure 2C:
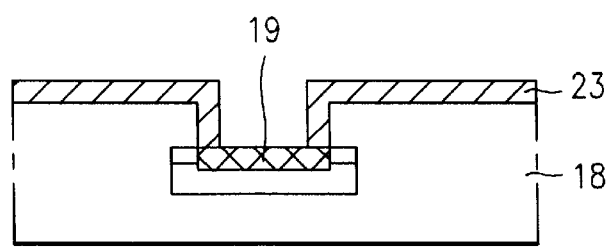

Simultaneously, as shown in FIG. 2c, the density of the silicon oxidation film 18 is increased while a part of the silicon oxidation film 18 is changed to a diffusion barrier material capable of preventing the diffusion of Cu. As a result, a transmutation layer 23 is formed.

In addition, a metal transmutation layer 19 of silicide or nitride is partially formed on the surface of the high melting point metal film 16. That is, silicide of $TiSi_2$, $TaSi_2$ and $WSi_2$, etc., or nitride of TiN, TaN and WN, etc., is formed.

Figure 2D:
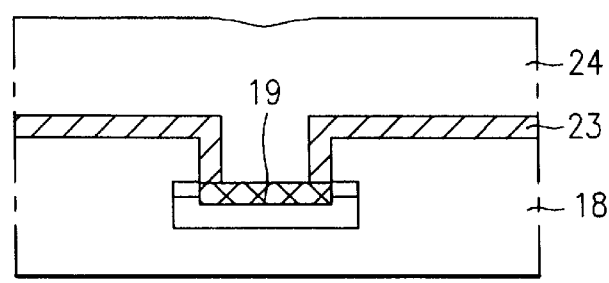

In FIG. 2d, a conductive material layer is formed through the Cu sputtering or CVD method using a source of (hfac) Cu(VTMS), etc., and is etched back by the CMP method to form the upper conduction line 24. At this time, the upper conduction line 24 can be formed by forming a plug by a select deposition method and sputtering of Cu.

A barrier alloy layer of TiN and the like may additionally be formed for preventing an adhesion or diffusion between the upper conduction line 24 and the silicon oxidation film 18. The barrier alloy layer is formed either between the upper conduction line 24 and the transmutation layer 23 or between the transmutation layer 23 and the silicon oxidation film 18.

Figure 3A:
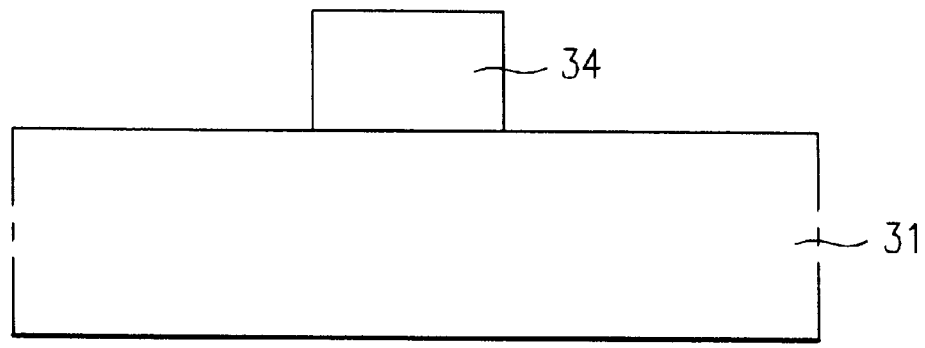
FIGS. 3a and 3b are sectional views for explaining a manufacturing process of a metal wiring in accordance with a third embodiment of the present invention.
Figure 3B:
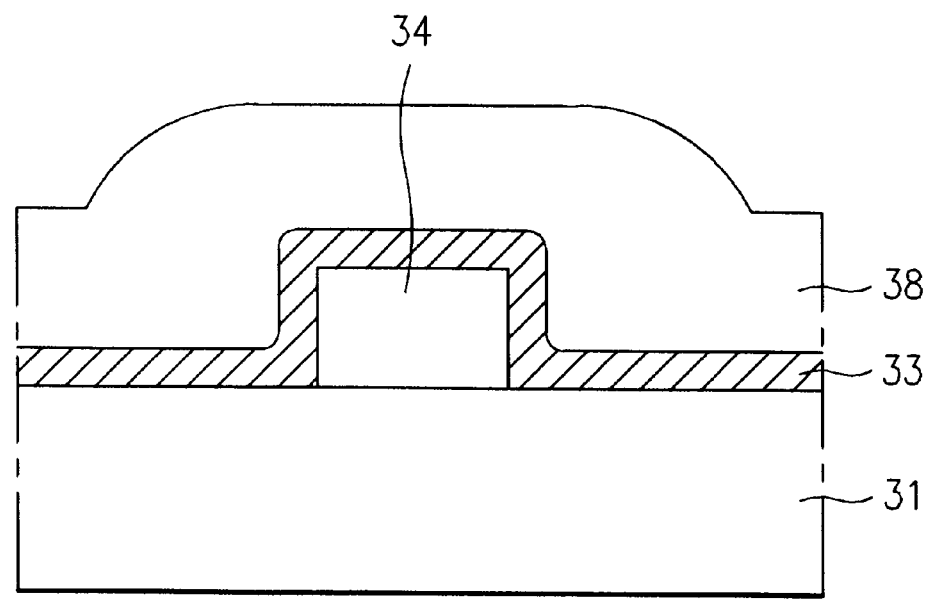

In FIGS. 3a to 3b showing views for explaining the metal wiring forming process in accordance with the third embodiment of the present invention, a pattern of Cu film is formed on a silicon oxidation film. During the formation of the silicon oxidation film, one or more doping gases among $BH_3$, $PH_3$, $SiH_4$, $Si_2H_6$, $NH_3$, $N_2O$ are injected into the silicon oxidation film to suppress diffusion of Cu resident in the Cu film.

That is, as shown in FIG. 3a, Cu is deposited on the silicon oxidation film 31 formed on a semiconductor substrate (not shown) and is patterned to form a conductive material layer 34.

In FIG. 3b, the doping gases, which use main reactive gases $SiH_4$, $SiF_4$ and $O_2$ and which include the impurity atoms of $BH_3$, $PH_3$, $SiH_4$ $Si_2H_6$, $NH_3$, $N_2O$, are injected by plasma, ECR or other high density plasma (HDP) deposition device. The doping gases are deposited under the temperature of 300–400° C. for 10 seconds or more, to form a transmutation layer 33. Then, an interfacial insulator film 38 is formed on the entire surface. The portions of layers surrounding the conductive material layer 34 have higher impurity concentration level than the silicon oxidation film 31. That is, the density of impurity in the transmutation layer 33 is higher than the density of impurity in the interfacial insulator film 38 and the lower portion of the silicon oxidation film 31. Furthermore, a barrier alloy layer such as TiN can be formed for preventing the diffusion of Cu. The barrier alloy layer can be formed between the conductive material layer 34 and the transmutation layer 33 or on the top surface of the silicon oxidation film 31 between the conductive material layer 34 and the silicon oxidation film 31.

In the metal wiring forming method of the present invention as described previously, the parasitic capacitance and the diffusion are effectively suppressed by transforming part of the silicon oxidation film 31 into a material capable of preventing diffusion of Cu. Consequently, when Cu is used as a material for the wiring of the conductive material having a relatively fast oxidation and diffusion rate, increasing the density of the silicon oxidation film to form a transmutation layer while maintaining the permittivity of the silicon oxidation enhances the reliability of the semiconductor device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a metal wiring of a semiconductor device, comprising the steps of:

forming a trench in a silicon oxidation film formed on a semiconductor substrate;

forming a transmutation layer on a bottom of the trench in said silicon oxidation film; and depositing a conductive material on said transmutation layer to form a conduction line.

2. A method as claimed in claim 1, wherein said transmutation layer is plasma-processed under a pressure of approximately 0.5–10 torr, Rf power of approximately 0.5–2 W/cm$^2$ and a temperature of approximately 350–450° C. during approximately 10–180 seconds.

3. A method as claimed in claim 1, wherein said conductive material includes one of copper, aluminum and silver.

4. A method as claimed in claim 1, wherein said transmutation layer is formed of a compound type of $Cu_3B_2$, $Cu_3P$, $Cu_3Si$ or $Cu_2N$, or an oxide type of $Cu(BO_2)_2$, $Cu_3(PO_4)_2$, $CuSiO_4$ or $Cu2(NO_3)_2$.

5. A method as claimed in claim 1, wherein said transmutation layer includes one of B, P, Si and N.

6. A method as claimed in claim 1, wherein said transmutation layer is formed using one or more gases selected from gas types of $BH_3$, $PH_3$, $SiH_4$, $Si_2H_6$, $NH_3$ and $N_2O$.

7. A method as claimed in claim 6, wherein said step of forming the transmutation layer includes the step of:

injecting said one or more gases into the silicon oxidation film using a carrier gas.

8. A metal wiring forming method for a semiconductor device, comprising the steps of:

selectively removing a silicon oxidation film having a lower conduction line to expose a surface of the lower conduction line through a trench formed in the silicon oxidation film;

forming a transmutation layer on a bottom of the trench by transforming the exposed surface of the lower conduction line; and forming a conductive material layer on said transmutation layer to form an upper conduction line.

9. A metal wiring forming method as claimed in claim 8, wherein said surface of said lower conduction line includes a metal layer having a high melting point.

10. A metal wiring forming method as claimed in claim 8, wherein said transmutation layer is plasma-processed under a pressure of approximately 0.5–10 torr, Rf power of approximately 0.5–2 W/cm$^2$ and a temperature of approximately 350–450° C. during approximately 10–180 seconds.

11. A metal wiring forming method as claimed in claim 8, further comprising the step of:

forming a metal barrier on the surface of said lower conduction line by a plasma process.

12. A metal wiring forming method as claimed in claim 8, wherein said conductive material layer for forming said upper conduction line includes one of copper, aluminum and silver.

13. A metal wiring forming method as claimed in claim 8, wherein said transmutation layer includes one of Si and N.

14. A metal wiring forming method as claimed in claim 11, wherein said metal barrier includes one of Si and N.

15. A metal wiring forming method as claimed in claim 11, wherein said metal barrier formed on a conductive material layer is silicide or nitride.

16. A method for forming wiring for a semiconductor device, comprising the steps of:

providing an insulator film;

forming a conduction line, made of a conductive material layer, on said insulator film; and forming a transmutation layer covering said conduction line and said insulator film, wherein an impurity density level of said transmutation layer and an upper portion of said insulator film is higher than an impurity density level of a lower portion of said insulator film.

17. A method as claimed in claim 16, wherein said step of forming the transmutation layer includes the step of:

adding impurities to said insulator film, said impurities including one or more atom types of B, P, Si, and N.

18. A method as claimed in claim 16, wherein said transmutation layer is formed of a compound type of $CU_3B_2$, $Cu_3P$, $Cu_3Si$ or $Cu_2N$, or an oxide type of $Cu(BO_2)_2$, $Cu_3(PO_4)_2$, $CuSiO_4$ or $Cu2(NO_3)_2$.

19. A method as claimed in claim 16, wherein a density of the upper portion of said insulator film is approximately 2.22 g/cm3 or more.

20. A method as claimed in claim 16, wherein said providing step includes the step of:

injecting one or more gases selected from gas types of $BH_3$, $PH_3$, $SiH_4$, $Si_2H_6$, $NH_3$ and $N_2O$ into said insulator film.

21. A method as claimed in claim 20, wherein said one or more gases are introduced into the insulator film using a $N_2$ gas or Ar gas.

22. A method as claimed in claim 1, wherein in said depositing step, the conductive material substantially fills the trench.

23. A method as claimed in claim 22, wherein in said depositing step, a top surface of the deposited conductive material in the trench is substantially coplaner with a top surface of the formed transmutation layer.

24. A method as claimed in claim 1, wherein in said step of forming the transmutation layer, the transmutation layer is formed on side surfaces of the trench and on a top surface of the silicon oxidation film.

25. A method as claimed in claim 8, wherein in said step of forming the conductive material layer, the conductive material layer completely fills the trench and has a substantially flat top surface.

* * * * *